(12) United States Patent
Pfirsch et al.

(10) Patent No.: US 9,515,149 B2
(45) Date of Patent: Dec. 6, 2016

(54) POWER SEMICONDUCTOR DEVICE

(71) Applicant: Infineon Technologies AG, Neubiberg (DE)

(72) Inventors: Frank Dieter Pfirsch, Munich (DE); Holger Huesken, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/731,007

(22) Filed: Jun. 4, 2015

(65) Prior Publication Data

US 2016/0035821 A1    Feb. 4, 2016

(30) Foreign Application Priority Data

Jun. 9, 2014   (CN) ................. 2014 2 0301951 U

(51) Int. Cl.

| | |
|---|---|
| *H01L 29/74* | (2006.01) |
| *H01L 31/111* | (2006.01) |
| *H01L 29/40* | (2006.01) |
| *H01L 29/739* | (2006.01) |
| *H01L 29/08* | (2006.01) |
| *H01L 29/06* | (2006.01) |

(52) U.S. Cl.
CPC .......... *H01L 29/407* (2013.01); *H01L 29/083* (2013.01); *H01L 29/7395* (2013.01); *H01L 29/0638* (2013.01)

(58) Field of Classification Search
CPC ............... H01L 29/407; H01L 29/1095; H01L 29/7395; H01L 29/0607; H01L 29/083
USPC ............... 257/139, 340, 409, 511, 512, 526, 552,257/556, 565, 47, 197
See application file for complete search history.

(56) References Cited

U.S. PATENT DOCUMENTS

| | | | |
|---|---|---|---|
| 2012/0104555 A1 | 5/2012 | Bobde et al. | |
| 2014/0264433 A1* | 9/2014 | Hu | H01L 29/7395 257/139 |
| 2014/0332845 A1* | 11/2014 | Bobde | H01L 29/7395 257/139 |

* cited by examiner

*Primary Examiner* — Thien F Tran
(74) *Attorney, Agent, or Firm* — Murphy, Bilak & Homiller, PLLC

(57) ABSTRACT

A semiconductor device includes an active region and a semiconductor substrate layer having a lower part semiconductor layer of a second conductivity type. The active region includes a drift region formed by at least a part of the substrate layer, a body region of the second conductivity type formed on at least a part of the drift region, a source region of a first conductivity type disposed in the body region, and a first doped region of the first conductivity type at least partially disposed under the body region. A groove extends downward from a top of the substrate layer and contains a shielding electrode. A depth of the groove is greater than that of the first doped region. A gate at least partially formed above at least a part of the source region and the body region is electrically insulated from the shielding electrode.

18 Claims, 5 Drawing Sheets

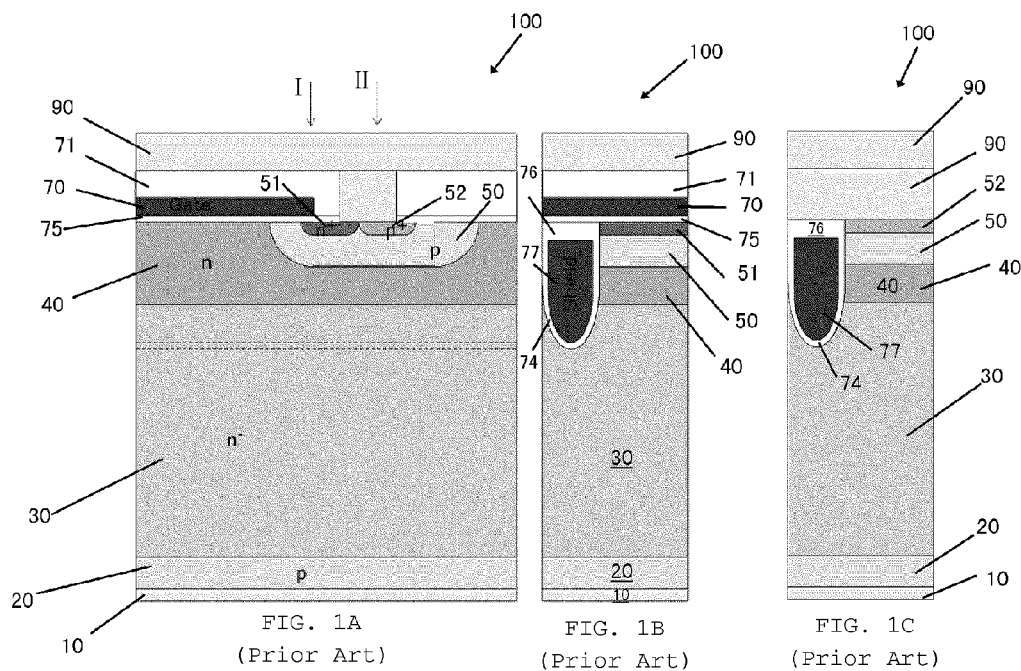
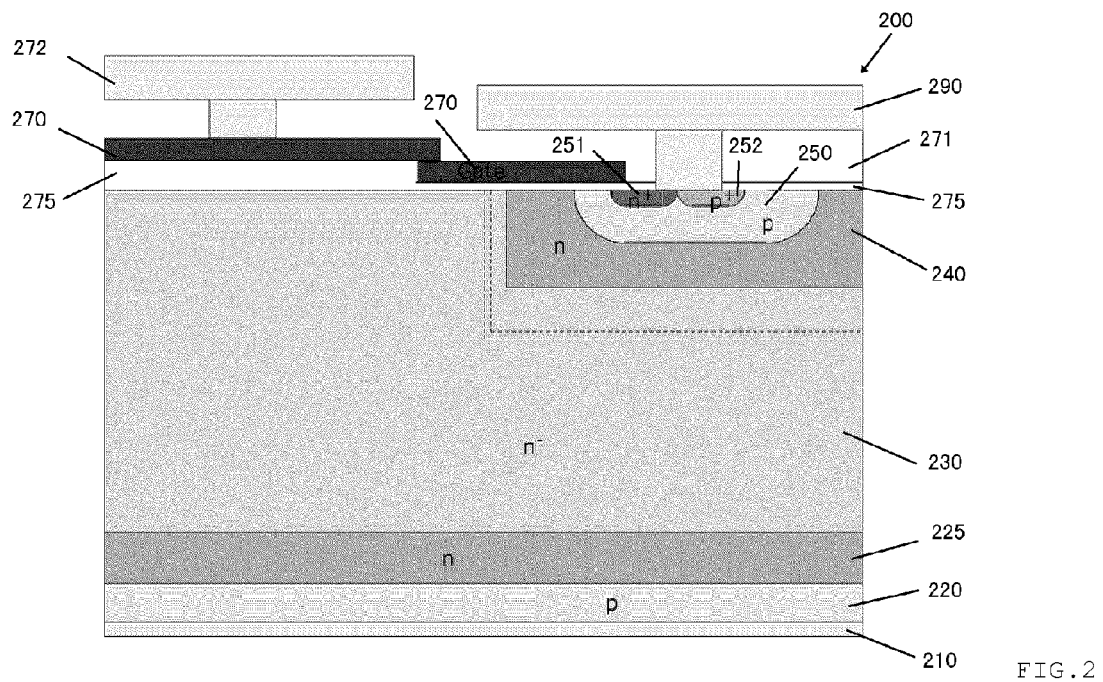
FIG. 1A (Prior Art)
FIG. 1B (Prior Art)
FIG. 1C (Prior Art)
FIG. 2

POWER SEMICONDUCTOR DEVICE

PRIORITY CLAIM

This application claims priority to Chinese Utility Model Application No. 201420301951.8 filed on 9 Jun. 2014, the content of said application incorporated herein by reference in its entirety.

TECHNICAL FIELD

The present application relates to a power semiconductor device, and in particular to an improved Insulated Gate Bipolar Transistor (IGBT).

BACKGROUND ART

Power semiconductor devices are widely used as electrical power conversion devices in consumer electronics, industrial machines, motor vehicles and high-speed trains, etc. By means of the improvements on the structure, the improvements of the performance are achieved year by year. Compared with a planar device, a power device using groove technology provides a channel width with an obvious increase per unit area. In addition, a semiconductor device using groove technology provides an excellent switch characteristic and is used in applications having requirements for fast switching.

In accordance with United States patent application US2012/0104555A1, an IGBT having a planar gate is described, wherein the IGBT exhibits a shielding electrode in a groove, which shielding electrode is isolated from a gate electrode and connected to a source terminal. Furthermore, this IGBT has an n-region in the upper part of a drift region with a higher doping concentration than that of the drift region. The unit has one source region 140 and one gate at one side of the source region. A p+ contact region 142 is placed at the other side of the unit. The drawbacks of this structure are a small channel width per area and a slightly non-uniform arrangement of MOS channels.

SUMMARY

The inventors of the present application recognize that in the groove shielding IGBT of US2012/0104555A1, a heavily doped layer 145 (i.e. an n-region) is deployed to continuously cover an n-type drift region 110 and extend through the entire chip, which causes a breakdown voltage blocking a pn-junction to be decreased, especially in a region of a device without a shielding groove (e.g., a gate pad or an edge termination). Therefore, the inventors of the present application propose an improved structure to overcome or at least alleviate the drawbacks of US2012/0104555A1.

One of the objects of the present application is to overcome the above-mentioned one or more limits in the prior art so as to substantially use a structured doped region of the same conductivity type as that of a source region only in a unit field, but not under a gate pad and/or not on an upper surface in a majority of edge terminations.

An edge termination or a termination region is a region which separates an active region from the edge of a physical chip, and it is designed in such a way that an applied voltage (which is vertically supported in the active region) is transversely supported. In the termination region, no conductive channel is opened during a conducting state of a device.

Disclosed in the present application is a power semiconductor device, the power semiconductor device comprising: a semiconductor substrate layer which has a lower part semiconductor layer of a second conductivity type; and an active region which comprises: a drift region formed by at least a part of the semiconductor substrate layer; a body region of the second conductivity type which is formed on at least a part of the drift region; a source region of a first conductivity type which is located in the body region; a first doped region of the first conductivity type which is at least partially located under the body region, wherein the doping concentration of the first doped region is higher than that of the semiconductor substrate layer; an emitter electrode connected to the source region; a groove which extends downward from the top of the semiconductor substrate layer and contains a shielding electrode, the shielding electrode being connected to the emitter electrode, wherein the depth of the groove extending to the substrate layer is greater than that of the first doped region; and a gate which is at least partially formed above at least a part of the source region and the body region and further electrically insulated from the shielding electrode, wherein the semiconductor substrate layer is in direct contact with an insulation layer arranged on the semiconductor substrate layer.

In one embodiment, the extension of the first doped region in at least one transverse direction is less than twice of a transverse extension of the body region.

In another embodiment, the first doped region is in a well shape and encompasses the body region.

In another embodiment, the semiconductor substrate layer is in direct contact with a part of the body region.

In another embodiment, the first doped region has a non-uniform doping concentration, and a region of the first doped region with the highest doping concentration is located below the body region.

In another embodiment, the first doped region is terminated from extending away into an edge termination region of the power semiconductor device.

In another embodiment, the power semiconductor device further comprises a gate pad for electrically contacting a gate electrode of the gate, wherein the semiconductor substrate layer is in direct contact with an insulation layer below the gate pad.

In another embodiment, the groove is structured to not extend into a region under the gate pad.

In another embodiment, the first doped region is structured to extend no farther than the groove in the transverse direction.

In another embodiment, a second doped region of the second conductivity type in the body region is adjacent to or not adjacent to the source region.

In another embodiment, the source region is farther from the region under the gate electrode connected to the gate in the transverse direction than the second doped region.

In another embodiment, the edge termination region comprises a channel stop region located near or at the edge of the power semiconductor device, wherein the channel stop region is of the same doping type as that of the source region.

In another embodiment, the channel stop region is at the same vertical depth to the insulation layer as that of the first doped region.

In another embodiment, the edge termination region further comprises one or more field limiting rings of the same doping type as that of the body region, wherein the field limiting rings are in contact with corresponding pads.

In another embodiment, the edge termination region further comprises additional doped regions which are located at one side of the field limiting rings near a unit field region and are of the first conductivity type.

In another embodiment, the semiconductor device is a vertical power device and comprises a collector which is located at the bottom of the semiconductor substrate layer and is in contact with the lower part semiconductor layer, and the gate comprises at least one of a planar gate, a vertical gate and a combination thereof.

In another embodiment, the power semiconductor device further comprises: a third doped region of the first conductivity type which is located between the semiconductor substrate layer serving as the drift region and the lower part semiconductor layer serving as a collector region.

In another embodiment, a part of the semiconductor substrate layer is in direct contact with a part of the insulation layer outside of the active region.

BRIEF DESCRIPTION OF THE DRAWINGS

The accompanying drawings are included so as to provide a further understanding of the present application, and the accompanying drawings are incorporated in the specification and constitute a part thereof. The accompanying drawings show the embodiments of the present application and are used together with the description to explain the principle of the present application. Other embodiments of the present application and many expected advantages will be readily recognized, because, with reference to the detailed description below, they will become better understood. The elements of the accompanying drawings are not necessarily in proportion relative to each other. Similar reference numerals represent corresponding similar parts.

FIGS. 1A, 1B and 1C show schematic sectional views of a groove shielding IGBT according to the prior art, wherein FIG. 1A is a sectional view of the groove shielding IGBT of the prior art in the direction of a shielding groove, FIG. 1B is a sectional view of the IGBT of FIG. 1A along an arrowhead I, and FIG. 1C is a sectional view of the IGBT of FIG. 1A along an arrowhead II.

FIG. 2 is a schematic sectional view of an IGBT according to one embodiment of the present application.

FIG. 8B is a sectional view of the IGBT of FIG. 8A along an arrowhead I, and FIG. 8C is a sectional view of the IGBT of FIG. 8A along an arrowhead II.

FIG. 9B is a sectional view of the IGBT of FIG. 9A along an arrowhead I, and FIG. 9C is a sectional view of the IGBT of FIG. 9A along an arrowhead II.

FIG. 10B is a sectional view of the IGBT of FIG. 10A along an arrowhead I, and FIG. 10C is a sectional view of the IGBT of FIG. 10A along an arrowhead II.

DETAILED DESCRIPTION

Figure 3:
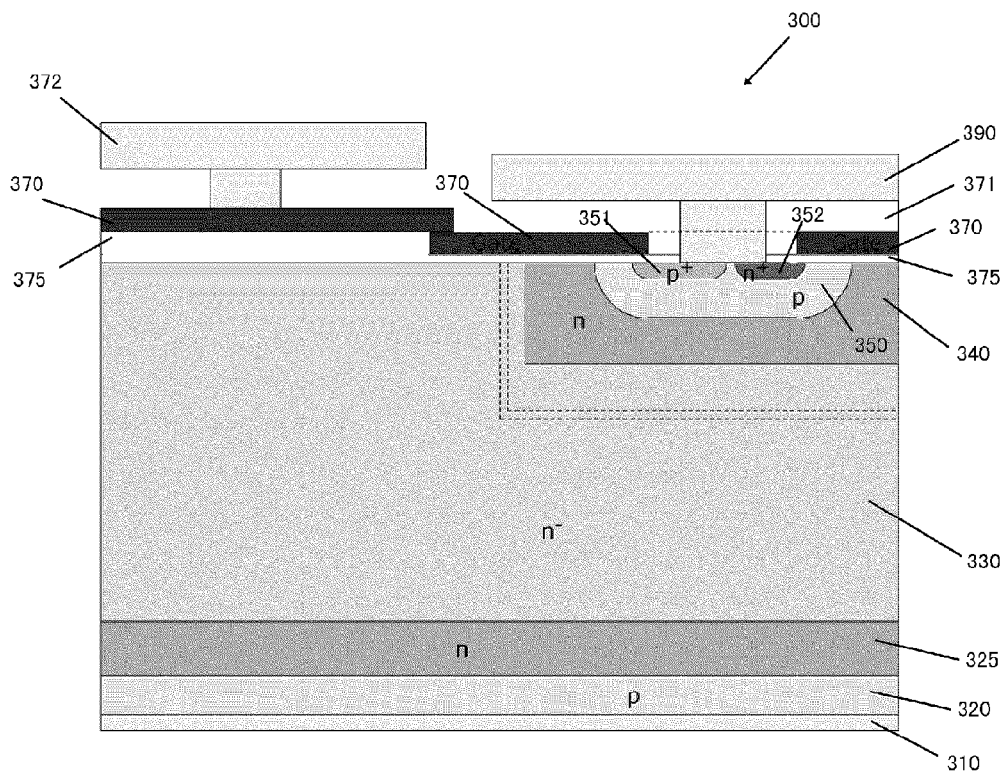
FIG. 3 is a schematic sectional view of an IGBT according to one embodiment of the present application.

In the detailed description below, reference is made to the accompanying drawings forming a part thereof, and in the accompanying drawings, specific embodiments in which the present application can be carried out are shown by means of illustration. It is to be understood that other embodiments may be utilized and structural or logical changes may be made without departing from the scope of the present application. By way of example, the features shown or described as a part of one embodiment can be used in combination with other embodiments so as to produce another embodiment. The present application is intended to comprise such modifications and variations. Examples are described with a specific language which should not be interpreted as limiting the scope of the accompanying claims. The accompanying drawings are not in proportion, but are only for illustrative purposes. For clarity, unless otherwise stated, the same reference numerals are used in different accompanying drawings to represent the same elements or manufacturing processes.

As used in the specification, the term "electrically coupled" is not intended to mean that elements must be directly coupled together. Instead, an intermediate element may be provided between elements which are "electrically coupled". As an example, some, all or none of the intermediate elements may be controllable so as to provide low-ohmic connections between the elements which are "electrically coupled" and to provide non-low-ohmic connections at another time. The term "electrically connected" is intended to describe a low-ohmic electrical connection between elements which are electrically connected together, for example, a connection through metals and/or highly doped semiconductors.

Some of the drawings refer to relative doping concentrations by indicating "−" or "+" beside the doping types. For example, "$n^-$" refers to a doping concentration which is less than that of an "n"-doped region, while an "$n^+$"-doped region has a larger doping concentration than that of the "n"-doped region. Doped regions having the same relative doping concentration may have or may not have the same absolute doping concentration. By way of example, two different $n^+$-doped regions may have different absolute doping concentrations. This also applies to, for example, an $n^-$-doped region and a $p^+$-doped region. In the embodiments described below, the conductivity types of the illustrated semiconductor regions are represented as n-type or p-type, to be more detailed, one of $n^-$ type, n-type, $n^+$-type, $p^-$-type, p-type and $p^+$-type. In each of the illustrated embodiments, the conductivity types of the illustrated semiconductor regions may be opposite. In other words, in an alternative embodiment of any one of the embodiments described below, the illustrated p-type regions may be of n-type, and the illustrated n-type regions may be of p-type.

The terms such as "first" and "second" and the like are used to describe various structures, elements, regions, sections, and the like, and are not intended to be limiting. Similar terms refer to similar elements throughout the entire description.

The terms "having", "containing", "including", "comprising" and the like are open and the terms indicate the presence of stated elements or features but do not preclude additional elements or features. The articles "a", "an" and "the" are intended to comprise plurals and singulars unless the context clearly dictates otherwise.

The term "substrate" or "semiconductor substrate" used in the following descriptions may comprise any semiconductor-based structure having a semiconductor surface. It is to be understood that these structures comprise silicon, silicon-on-insulator (SOI), silicon-on-sapphire (SOS), doped and undoped semiconductors, silicon epitaxial layers supported by a basic semiconductor base portion and other semiconductor structures. The semiconductors are not necessarily silicon-based. The semiconductors may also be silicon-germanium, germanium or gallium arsenide. According to the embodiments of the present application, silicon carbide (SiC) or gallium nitride (GaN) is typically a further example of the semiconductor substrate material.

An n-channel IGBT is taken as an example for detailed description of the present application below, wherein the body region is of p-type and the source region is of n-type. However, the present application can be readily transferred to a p-channel IGBT by exchanging n-type and p-type.

FIGS. 1A, 1B and 1C show schematic sectional views of a groove shielding IGBT 100 according to the prior art, wherein FIG. 1A is a sectional view of the groove shielding IGBT 100 of the prior art in the direction of a shielding groove, FIG. 1B is a sectional view of the IGBT 100 of FIG. 1A along an arrowhead I, and FIG. 1C is a sectional view of the IGBT 100 of FIG. 1A along an arrowhead II.

As illustrated in FIG. 1A, provided is a semiconductor substrate layer 30 which may comprise but is not limited to silicon of a first conductivity type, for example, an n-type. The semiconductor substrate layer 30 may comprise an epitaxial layer or a substrate layer. The semiconductor substrate layer 30 may have a lower part semiconductor layer 20 of a second conductivity type, for example, a p-type. The lower part semiconductor layer 20 may also be a substrate layer or may be implanted in the semiconductor substrate layer 30.

In the present example, the p-type lower part semiconductor layer 20 is the collector region of the IGBT device and the n⁻-type substrate layer 30 is the drift region of the IGBT device. An n-type doped region 40 is arranged above the n⁻-type drift region 30, and accordingly, a p-type body region 50 is arranged in the n-type doped region 40; in addition, an n⁺ source region 51 and an optional p⁺ region 52 adjacent to the n⁺ source region 51 are formed in the p-type body region 50. As shown in FIG. 1A, the IGBT is a vertical IGBT device, wherein a collector 10 is deposited on the bottom face of the device, i.e. on the collector region 20, and an emitter electrode 90 is deposited on the top face of the device, i.e. the n⁺ source region 51, and the optional p⁺ region 52. For example, the above-mentioned regions are formed by means of semiconductor processes such as photo-etching, etching, oxidization and injection. In addition, a gate electrode 70 is arranged on the top face of the device, wherein the gate electrode 70 is isolated from the p-type body region 50 and the n-type doped region 40 via an isolation layer 75, as illustrated in FIG. 1A.

With reference to FIG. 1B, a sectional view of the IGBT 100 of FIG. 1A along an arrowhead I is illustrated. As illustrated in FIG. 1B, a groove 76 which extends from the top face into the drift region 30 is also arranged in a unit field region of the IGBT 100, and a shielding electrode 77 which is isolated from the gate electrode 70 through the isolation layer 75 and is connected to the emitter electrode 90 (not illustrated in the drawing) is arranged in the groove 76, wherein two dotted lines in FIG. 1A respectively illustrate depth locations of the groove 76 and the shielding electrode 77 in the device. It should be pointed out that the groove 76 may be for example lined with a dielectric layer 74 of such as oxides and the like. The dielectric layer 74 (also referred to as a groove insulation structure) insulates the shielding electrode 77 from the gate electrode 70 and insulates the shielding electrode 77 from the n-type doped region 40 and the n⁻-type drift region 30. Furthermore, the isolation layer 75 extends horizontally and is located on the top of the device, and it isolates at least a part of the source region 51, the body region 50 and the n-type doped region 40 from the gate electrode 70. The isolation layer 75 for example may be gate electrode dielectric (for example, gate oxides). The groove insulation structure 74 for example may comprise gate oxides or filed oxides.

FIG. 1C is a sectional view of the IGBT 100 of FIG. 1A along an arrowhead II. Except that the structures of the top are slightly different, FIG. 1C is substantially similar to FIG. 1B in structure. In particular, from top to bottom in FIG. 1C are respectively the emitter electrode 90, the optional p⁺ region 52, the body region 50, the n-type doped region 40, etc.; and from top to bottom in FIG. 1B are respectively the emitter electrode 90, an inter-layer dielectric layer 71, the gate electrode 90, the isolation layer 75, the n⁺ source region 51, the n-type doped region 40, etc., wherein the inter-layer dielectric layer 71 (such as SiO₂ or silicon nitride) is used to isolate the emitter electrode 90 from the gate electrode. It needs to supplement and illustrate that, for clarity, the emitter electrode (the vertical part of 90) and the emitter electrode pad (the horizontal part of 90) are not distinguished in the drawings.

In one embodiment, the emitter electrode 90 and the collector 10 may be constituted by main components, aluminum (Al), copper (Cu), or alloys of aluminum or copper (for example, AlSi, AlCu or AlSiCu) or contains main components, aluminum (Al), copper (Cu), or alloys of aluminum or copper (for example, AlSi, AlCu or AlSiCu). According to other embodiments, the emitter electrode 90 and the collector 10 may contain main components nickel (Ni), titanium (Ti), silver (Ag), gold (Au), platinum (Pt) and/or palladium (Pd). For example, the emitter electrode 90 and the collector 10 may comprise two or more sub-layers, wherein each of the sub-layers contains one or more of main components Ni, Ti, Ag, Au, Pt and Pd and/or alloys thereof. In one embodiment, the materials of the gate electrode 70 and the shielding electrode 77 may be highly-conductive materials, for example, doped semiconductor materials such as doped poly-crystalline silicon.

In one embodiment, the isolation layer 75, the inter-layer dielectric layer 71 and the dielectric layer 74 may comprise one or more sub-layers, for example, a binding layer, a buffer layer and/or a diffusion barrier layer. According to one embodiment, the isolation layer 75 comprises a thermally-grown silicon oxide layer. The isolation layer 75, the inter-layer dielectric layer 71 and the dielectric layer 74 may further comprise a diffusion barrier layer, for example, a silicon nitride layer or a silicon oxynitride layer. For example, thin silicon oxide provided from the deposited oxide using TEOS as a precursor material or, for example, silicate glass of undoped silicate glass may form the bonding or buffer layer. The isolation layer 75, the inter-layer dielectric layer 71 and the dielectric layer 74 may further comprise a main dielectric layer provided from BSG (boro-silicate glass), PSG (phospho-silicate glass) or BPSG (boro-phospho-silicate glass). Other embodiments may provide fewer or more sub-layers.

As illustrated in FIG. 1, the continuous n-region 40 is adjacent to the upper surface of the device, and it has a higher doping level than that of the drift region 30 and extends over the entire chip, which will result in the aforementioned problem of breakdown voltage.

FIG. 2 is a schematic sectional view of an IGBT 200 according to one embodiment of the present application, wherein, in comparison with the groove shielding IGBT 100 of FIG. 1, the IGBT 200 of FIG. 2 has a structured n-region 240 (for example, there is no n-region under a gate pad 272) and the shielding groove (as illustrated by dotted lines in the drawing) does not extend to the gate pad region 272. For brevity and clarity, descriptions of the parts corresponding to FIG. 1 are omitted here. In FIG. 2, in order to distinguish the gate electrode from the gate pad, they are respectively denoted by reference numerals 270 and 272.

In FIG. 2, a part of the IGBT 200 located at the transition between the gate pad region (the left half part in the drawing) and the unit field region (the right half part in the drawing) is mainly illustrated. According to one embodiment of the present application, the n-region 240 which is adjacent to the upper surface does not extend to the region under the gate pad (it is also referred to as the gate pad region herein). Optionally, the shielding groove (illustrated by dotted lines in the drawing) also ends near the starting point of the gate pad region. In this case, the n-region 240 should not extend farther than the shielding electrode in the transverse direction.

It should be pointed out that the shape and location of the n-type doped region 240 and whether the doping distribution is uniform can be changed according to applications. For example, the n-type doped region 240 may be well-shaped and encompasses a body region 250.

In addition, in comparison with the groove shielding IGBT 100 of FIG. 1, the IGBT 200 of FIG. 2 alternatively comprises an extra n-type doped layer 225 arranged between the drift region 230 and the collector region 20.

FIG. 3 is a schematic sectional view of an IGBT 300 according to one embodiment of the present application, wherein, in comparison with the groove shielding IGBT 200 of FIG. 2, the IGBT 300 of FIG. 3 is provided with a source region 352 adjacent to the gate pad region, i.e. a device region under the gate pad 372, and wherein a connection between a left gate 370 and a right gate 370 (for example, made of poly-crystalline silicon) is completed in a third dimension (indicated by an upper dotted line). For brevity and clarity, descriptions of the parts corresponding to FIG. 2 are omitted herein.

As illustrated in FIG. 3, the locations of an $n^+$ source region 351 and the $p^+$ region 352 in a p-type body region 350 are exchanged relative to the locations of the two in FIG. 1, and the $n^+$ source region 351 and the $p^+$ region 352 are not directly adjacent, that is, the emitter electrode 390 is in direct contact with the $n^+$ source region 351, the $p^+$ region 352 and the p-type body region 350.

The effect of the arrangement in which the source region 352 is far away from the gate pad region lies in the enhancement of the over-current turn-off capability of the device. The same measure can also be used in an edge termination, as will be further explained in the following drawings.

Figure 4:
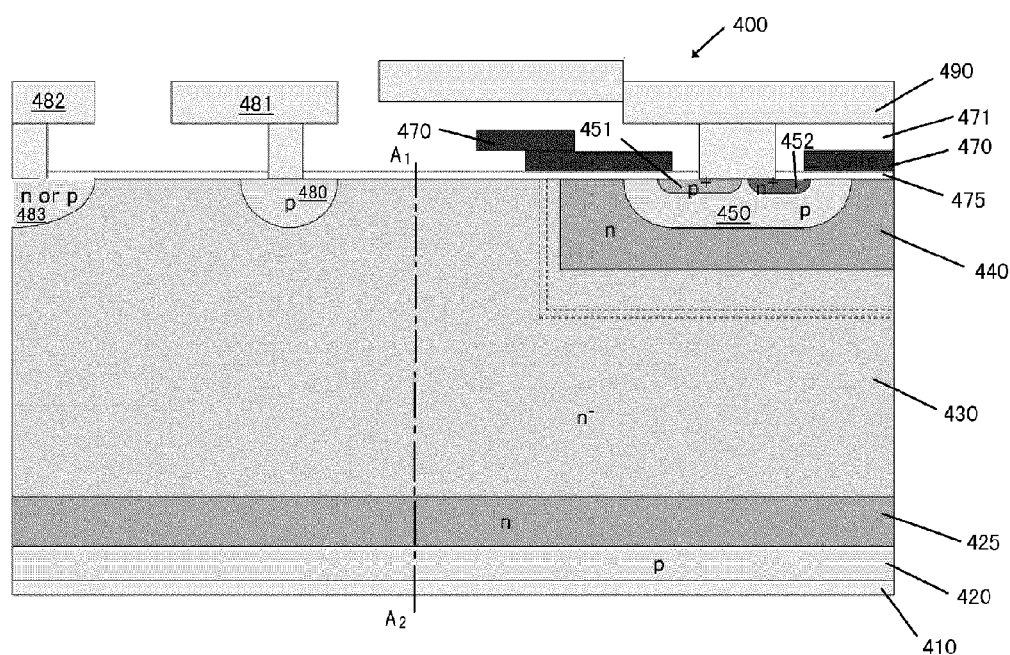
FIG. 4 is a schematic sectional view of an IGBT according to one embodiment of the present application.

FIG. 4 is an example of an edge termination of an IGBT 400 according to one embodiment of the present application, wherein the IGBT 400 of FIG. 4 has a structured n-region 440 (for example, there is no n-region in an edge termination region, i.e. the left half part of a dotted line A1-A2) and the shielding groove (indicated by double dotted lines) does not extend to the edge termination region. For brevity and clarity, descriptions of the parts corresponding to FIG. 3 are omitted herein.

Herein, the left half part of the dotted line A1-A2 in the drawing is a junction termination structure region (also referred to as the edge termination region of the device), and the right half part of the dotted line A1-A2 is a unit field region (also referred to as an active region of the device).

Note that, "edge termination" or "edge termination region" or "edge termination structure" can be used interchangeably.

In comparison with the IGBT 300 of FIG. 3, the structured n-region 440 can extend to the gate pad region (not illustrated in the drawing), but does not extend to the edge termination region, i.e. the left half part of the dotted line A1-A2. In other words, the unit field n-region 440 ends before the edge termination region, which is completely similar to the gate pad structure 372 in FIG. 3.

As an example, the edge termination structure illustrated here is in a field limiting ring form, but the present application can also be applied to any type of edge termination structure.

According to one embodiment, the field limiting ring for example can be a p-type field limiting ring 480. The edge termination structure may also comprise an n-type channel stop region 483. Furthermore, the n-type channel stop region 483 and the p-type field limiting ring 480 may be respectively connected to corresponding pads 482 and 481. As illustrated in FIG. 4, the n-type field limiting ring 483 is alternatively modified to be of p-type according to requirements.

In the edge termination, one problem is to prevent a space charge region from expanding to an outer edge of the chip. This can be achieved by using a separation part (using the same injection and the same diffusion) of the above-mentioned n-region 440 as the channel stop region near or at the edge of the chip, as will be further explained in FIG. 5 below.

Figure 5:
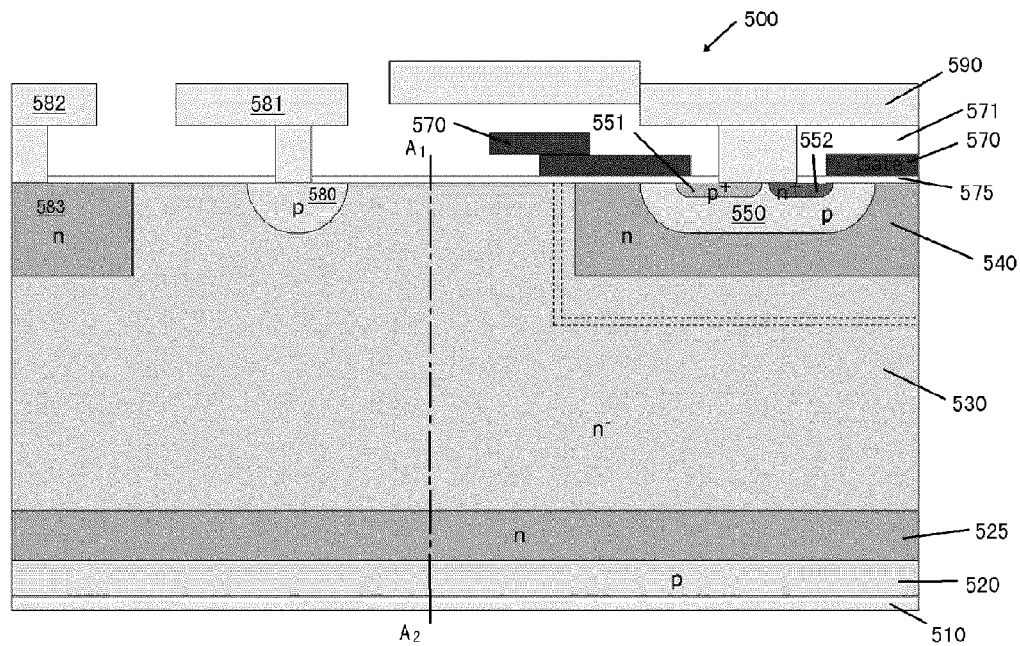
FIG. 5 is a schematic sectional view of a groove shielding IGBT similar to the IGBT of FIG. 4 according to one embodiment of the present application.

FIG. 5 is a schematic sectional view of a groove shielding IGBT 500 similar to the IGBT of FIG. 4 according to one embodiment of the present application, wherein a separation part of an n-region 540 is used as a channel stop region 583 in the edge termination, the channel stop region being located between the edge termination structure and the edge of the chip. For brevity and clarity, descriptions of the parts corresponding to FIG. 4 are omitted herein.

According to one embodiment, the channel stop region 583 may also make contact through a channel stop electrode 582. Alternatively, for example, the channel stop region 583 may be connected to an n-type doped layer 525 via a through-hole (not illustrated in FIG. 5) or be connected to a top electrode 582 or a bottom electrode 510 via other paths (not illustrated in FIG. 5).

In a further embodiment, especially in an edge termination structure having at least one field ring, it may be advantageous to have an additional n-region just before the field ring (when viewed from the unit field) in order to increase a punch-through voltage between a next internal p-region and this field ring, as will be further explained in FIGS. 6 and 7 below.

Figure 6:
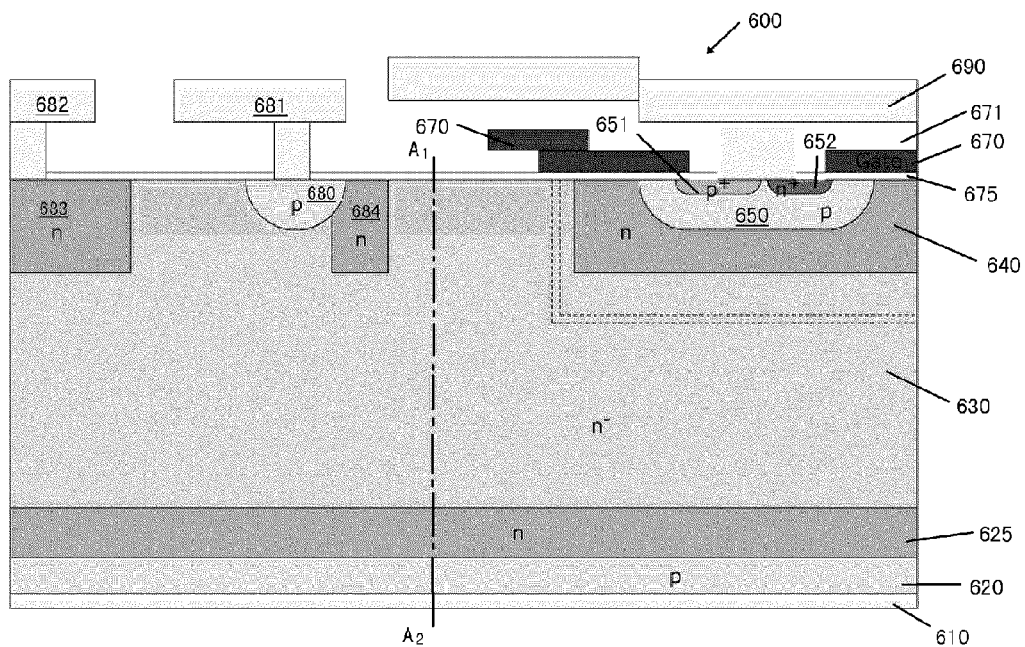
FIG. 6 is a schematic sectional view of a groove shielding IGBT similar to the IGBT of FIG. 5 according to one embodiment of the present application.

FIG. 6 is a schematic sectional view of a groove shielding IGBT 600 similar to the IGBT of FIG. 5 according to one embodiment of the present application, wherein the other part 684 of the n-region 640 is used near the field ring structure 680 of the edge termination in order to increase a punch-through voltage between an outermost p-region 650 of a unit field and the field ring 680. For brevity and clarity, descriptions of the parts corresponding to FIG. 5 are omitted herein.

In comparison with the IGBT 500 of FIG. 5, an additional n-region 684 located at one side close to the unit field region before the p-type field ring is also added in the IGBT 600 of FIG. 6.

Figure 7:
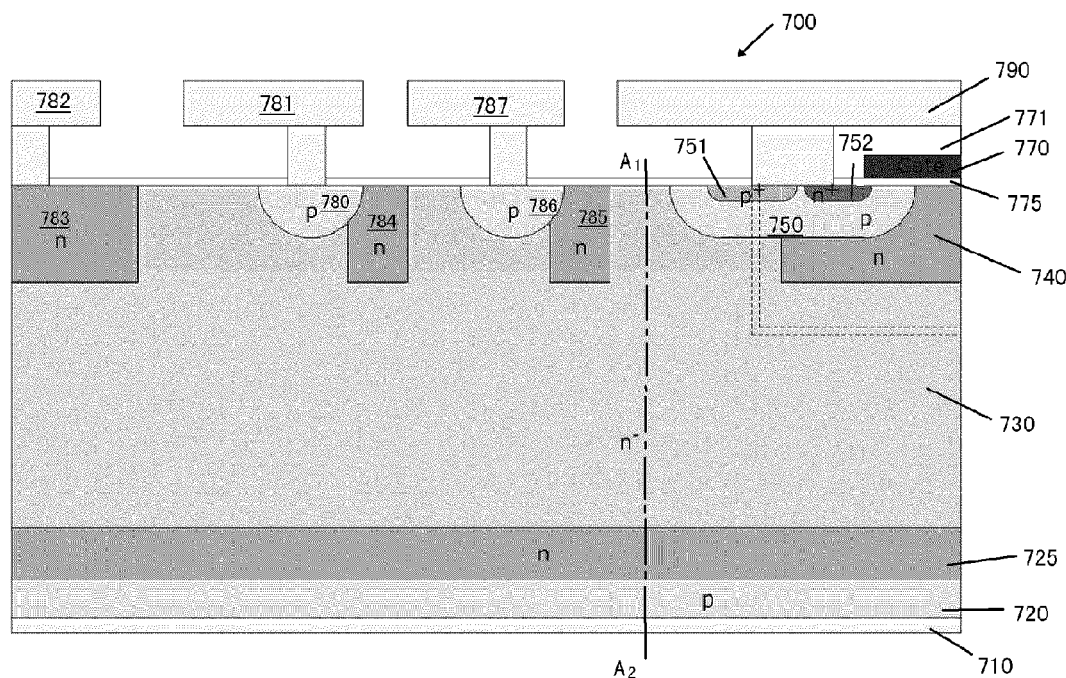
FIG. 7 is a schematic sectional view of a groove shielding IGBT similar to the IGBT of FIG. 6 according to one embodiment of the present application.

FIG. 7 is a schematic sectional view of a groove shielding IGBT 700 similar to the IGBT of FIG. 6 according to one embodiment of the present application, wherein two field ring structures 780 and 786 of an edge termination with n-regions 784 and 785 are illustrated, so as to increase a punch-through voltage between an outermost p-region 750 of a unit field and the field ring 786 and a punch-through voltage between the field rings 786 and 780, and wherein the outermost p-region 750 connected to a source electrode extends to the edge termination farther than the unit field n-region 740 and a shielding groove (indicated by double dotted lines). For brevity and clarity, descriptions of the parts corresponding to FIG. 6 are omitted herein.

In comparison with the IGBT of FIG. 6, the IGBT 700 of FIG. 7 has two field ring structures. Obviously, in other embodiments, the number of field ring structures may be for example three, four or more, which depends on the actual applications.

In addition, the p-type body region 750 of the IGBT 700 of FIG. 7 extends toward the edge termination structure (i.e. the left half part of the dotted line A1-A2) in the transverse direction farther than the unit field n-region 740 and the shielding groove (as indicated by the double dotted lines).

In addition, the above-mentioned arrangement may be unrelated to the type of the edge termination structure used.

In a further embodiment, the doping level of an emitter at the back of the IGBT in the junction termination region is lower than that of a unit region of the device. This causes a part of transistor gain to be decreased in the junction termination region, and this is a highly effective measure to improve the static and dynamic blocking behaviors of the device. Alternatively or additionally, a field stop region can be implemented in the junction termination region, or, if the field stop region is implemented in a unit region, the doping concentration of the field stop region in the junction termination region is higher than the doping concentration in the unit region. With regard to the case where the reverse blocking capability of the IGBT is not needed, a p-emitter in the junction termination region may also be omitted so as to avoid the actions of transistors in this region. Alternatively or additionally, the carrier lifetime of a free charge carrier in the junction termination region can be reduced, which, for example, is achieved by means of local diffusion of a heavy metal or by means of irradiation using high energy particles, such as, for example, protons, helium ions (preferably from the back of a wafer) or electrons.

Figures 8A, 8B, 8C:
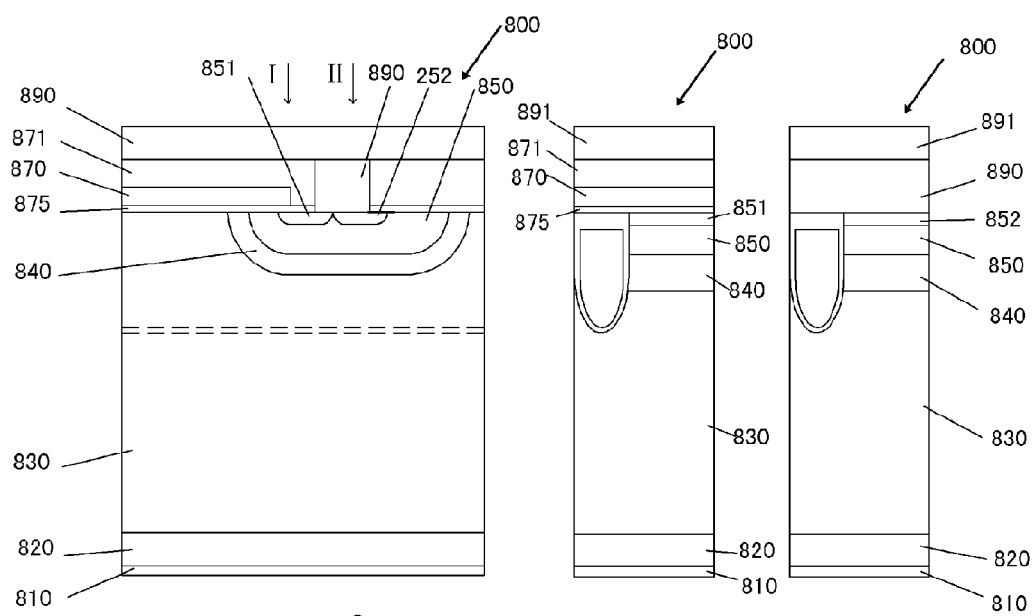
FIGS. 8A, 8B and 8C show schematic sectional views of an IGBT according to one embodiment of the present application, wherein a well-shaped n-type doped region encompasses a p-type body region.

FIGS. 8A, 8B and 8C show schematic sectional views of an IGBT 800 according to one embodiment of the present application, wherein a well-shaped n-type doped region 840 encompasses a p-type body region 850, FIG. 8B is a sectional view of the IGBT of FIG. 8A along an arrowhead I, and FIG. 8C is a sectional view of the IGBT of FIG. 8A along an arrowhead II. For brevity and clarity, descriptions of the parts corresponding to FIG. 1 are omitted herein.

The IGBT 800 of FIG. 8 differs from the IGBT 100 of FIG. 1 in that the n-type doped region 840 is well-shaped and encompasses the p-type body region 850. Again, the vertical extension of an n-type doped region 840 is relatively small, for example, far smaller than that of a groove 876 or a shielding electrode 877, as shown in FIG. 8A. According to one embodiment of the present application, the extension of the n-type doped region 840 in at least one transverse direction is less than twice of a transverse extension of the body region 850. In addition, the n-type doped region 840 is preferably uniform in thickness.

Figures 9A, 9B, 9C:
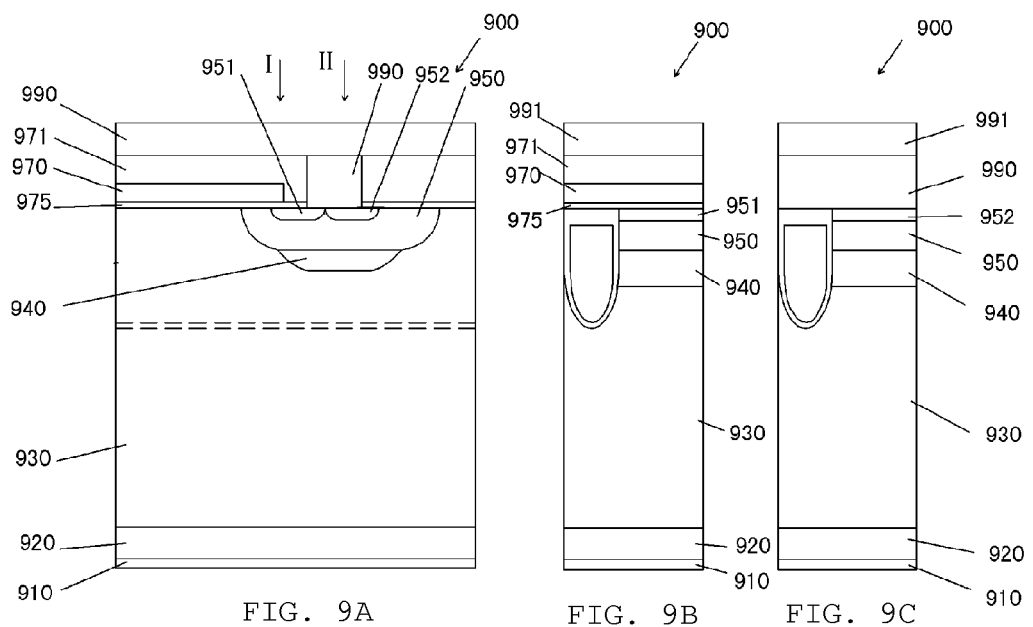
FIGS. 9A, 9B and 9C show schematic sectional views of an IGBT according to one embodiment of the present application, wherein an n-type doped region is located below a p-type body region.

FIGS. 9A, 9B and 9C show schematic sectional views of an IGBT 900 according to one embodiment of the present application, wherein an n-type doped region 940 is only located below a p-type body region 950, FIG. 9B is a sectional view of the IGBT of FIG. 9A along an arrowhead I, and FIG. 9C is a sectional view of the IGBT of FIG. 9A along an arrowhead II. For brevity and clarity, descriptions of the parts corresponding to FIG. 8 are omitted herein.

The IGBT 900 of FIG. 9 differs from the IGBT 800 of FIG. 8 in that a semiconductor substrate layer 930 is in direct contact with a part of a body region 950, and an n-type doped region 940 is only located below the p-type body region 950 and the thickness of the n-type doped region 940 changes transversely, i.e. being not uniform. For example, as illustrated in FIG. 9A, the n-type doped region 940 gradually becomes thinner at two ends. Furthermore, as illustrated in FIGS. 9B and 9C, the thickness of the n-type doped region 940 in FIG. 9B is less than that of the n-type doped region 940 in FIG. 9C, and this again shows that the thickness of the n-type doped region 940 changes.

In comparison with the structure disclosed in US2012/0104555A1, which incorporates a complete n-doped layer, the advantage of the device of FIG. 9 lies in obtaining an electric advantage (i.e. an increase in the concentration of plasmas) without the defect of a high electric field for a given desired breakdown voltage, especially in an HV termination region.

According to one embodiment of the present application, the structure of the present application (i.e. an additional n-type doped region 940 located below a p-type body region 950) can be achieved by means of internal diffusion of donor atoms, and thus the implementation of these donor atoms can be achieved for example by means of ion injection, wherein the injection energy is higher than that for injecting p-type atoms so as to create the p-type body region 950. In addition or alternatively, a diffusion coefficient of these donor atoms can be higher than that of acceptor atoms for manufacturing the p-type body region 950. Alternatively, the injection energy is sufficient so that an end-of-range of the injected ions is located below a pn-junction between the p-type body region 950 and a region where a donor concentration increases, and thus no significant internal diffusion is necessary. For this purpose, for example, proton irradiation can be used, because for this method, a relatively low injection energy is sufficient. The temperature of an annealing step after this proton irradiation is preferably located in a range between 380° C. and 420° C.

According to one embodiment of the present application, this additional n-type doped region can for example be interrupted in the transverse direction so as to improve the blocking capability. One or more interruptions can be anticipated; for example, several small strips having gaps with clear boundaries can be anticipated. The width and distance of these gaps may be constant or may change in the transverse direction.

Figures 10A, 10B, 10C:
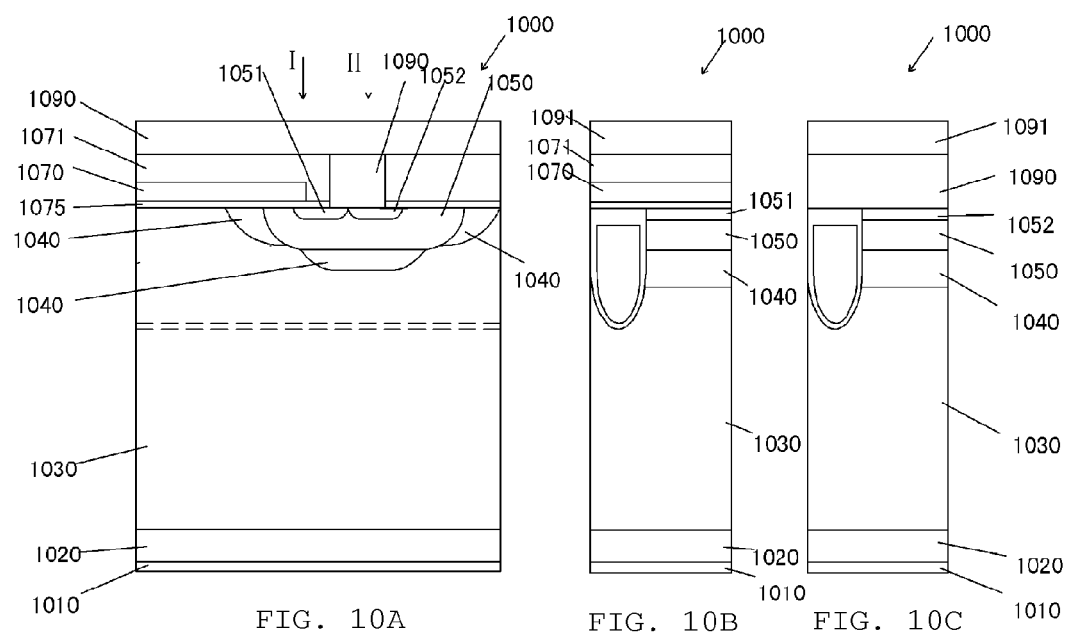
FIGS. 10A, 10B and 10C show schematic sectional views of an IGBT according to one embodiment of the present application, wherein an n-type doped region is located below a p-type body region and is adjacent to the p-type body region.

FIGS. 10A, 10B and 10C show schematic sectional views of an IGBT 1000 according to one embodiment of the present application, wherein an n-type doped region 1040 is located below a p-type body region 1050 and is adjacent to the p-type body region 1050, FIG. 10B is a sectional view of the IGBT 1000 of FIG. 10A along an arrowhead I, and FIG. 10C is a sectional view of the IGBT 1000 of FIG. 10A along an arrowhead II. For brevity and clarity, descriptions of the parts corresponding to FIG. 8 or 9 are omitted herein. According to FIG. 10, it can be seen that a semiconductor substrate layer 1030 is also in direct contact with a part of the body region 1050.

In a preferred embodiment, in a region in which the highest electric field strength occurs along a pn-junction between the p-type body region 1050 and the additional n-type doped region 1040, the additional n-type doped region 1040 is omitted, or at least the additional n-type doped region 1040 is manufactured with a lower donor dose. Typically, the region of the highest electric field strength is a region of a pn-junction having a high curvature. By means of this method, a relatively high additional n-type concentration below the p-type body region 1050 and a relatively high increase in the concentration of free charge carriers under the p-type body region 1050 in a region of the pn-junction parallel to the surface are achieved.

It is important to point out that there is a limit for this additional donor concentration, and, up to the limit, the blocking voltage will not be decreased, because the blocking voltage of the junction termination region is typically lower than that of the p-type body region; i.e. up to the limit, the decrease of $V_{ce\,sat}$ is possible without decreasing the blocking voltage.

Although the present application is described with the embodiments of IGBT hereinabove, the present application can also be applied to other types of power devices, such as a MOSFET, and the difference lies in that the unit field region comprises at least one field effect transistor structure instead of non-IGBT structures.

Although, with reference to various drawings, typical shapes of various regions are strip-shaped, they can also be encompassing designs, or squares, rectangles, rings or a combination thereof.

It is to be understood that the features of various embodiments described here can be combined with one another, unless particularly otherwise indicated.

Although particular embodiments have been illustrated and described here, a person skilled in the art will understand that the illustrated and described particular embodiments can be replaced with various alternative and/or equivalent implementations without departing from the scope of the present application. This application is intended to cover any modifications or changes of the particular embodiments discussed here. Therefore, the present application is intended to be limited only by the claims and equivalents thereof.

What is claimed is:

1. A power semiconductor device, comprising:
  a semiconductor substrate layer having a lower part semiconductor layer of a second conductivity type; and
  an active region which comprises:
    a drift region formed by at least a part of the semiconductor substrate layer;
    a body region of the second conductivity type formed on at least a part of the drift region;
    a source region of a first conductivity type disposed in the body region;
    a first doped region of the first conductivity type at least partially disposed under the body region, a doping concentration of the first doped region being higher than that of the semiconductor substrate layer;
    an emitter electrode connected to the source region;
    a groove extending downward from a top of the semiconductor substrate layer and containing a shielding electrode, the shielding electrode being connected to the emitter electrode, wherein a depth of the groove in the substrate layer is greater than that of the first doped region; and
    a gate at least partially formed above at least a part of the source region and the body region and electrically insulated from the shielding electrode,
    wherein the semiconductor substrate layer is in direct contact with an insulation layer arranged on the semiconductor substrate layer.

2. The power semiconductor device of claim 1, wherein an extension of the first doped region in at least one transverse direction is less than twice of a transverse extension of the body region.

3. The power semiconductor device of claim 1, wherein the first doped region encompasses the body region.

4. The power semiconductor device of claim 1, wherein the semiconductor substrate layer is in direct contact with a part of the body region.

5. The power semiconductor device of claim 1, wherein the first doped region has a non-uniform doping concentration, and a region of the first doped region with the highest doping concentration is located below the body region.

6. The power semiconductor device of claim 1, wherein the first doped region is terminated from extending away into an edge termination region of the power semiconductor device.

7. The power semiconductor device of claim 6, wherein the edge termination region comprises a channel stop region located near or at an edge of the power semiconductor device, wherein the channel stop region is of the same doping type as the source region.

8. The power semiconductor device of claim 7, wherein the channel stop region is at the same vertical depth with respect to the insulation layer as the first doped region.

9. The power semiconductor device of claim 8, wherein the edge termination region further comprises additional doped regions located at one side of the one or more field limiting rings near a unit field region and are of the first conductivity type.

10. The power semiconductor device of claim 6, wherein the edge termination region further comprises one or more field limiting rings of the same doping type as the body region, wherein each field limiting ring is in contact with a corresponding pad.

11. The power semiconductor device of claim 1, further comprising a gate pad electrically contacting a gate electrode of the gate, wherein the semiconductor substrate layer is in direct contact with a plurality of insulation layers below the gate pad.

12. The power semiconductor device of claim 11, wherein the groove is structured to not extend into a region under the gate pad.

13. The power semiconductor device of claim 12, wherein the first doped region is structured to extend no farther than the groove in the transverse direction.

14. The power semiconductor device of claim 11, further comprising a second doped region of the second conductivity type in the body region.

15. The power semiconductor device of claim 14, wherein the source region is farther from the region under the gate electrode connected to the gate in the transverse direction than the second doped region.

16. The power semiconductor device of claim 1, wherein the semiconductor device is a vertical power device having a collector located at a bottom of the semiconductor substrate layer and in contact with the lower part semiconductor layer, and the gate comprises at least one of a planar gate, a vertical gate and a combination of the planar gate and the vertical gate.

17. The power semiconductor device of claim 1, wherein the power semiconductor device further comprises a third doped region of the first conductivity type located between the semiconductor substrate layer which serves as the drift region and the lower part semiconductor layer which serves as a collector region.

18. The power semiconductor device of claim 1, wherein a part of the semiconductor substrate layer is in direct contact with a part of the insulation layer outside of the active region.

* * * * *